United States Patent [19]  [11] 4,335,504
Lee  [45] Jun. 22, 1982

[54] METHOD OF MAKING CMOS DEVICES

[75] Inventor: Steven N. Lee, Irvine, Calif.

[73] Assignee: Rockwell International Corporation, El Segundo, Calif.

[21] Appl. No.: 189,884

[22] Filed: Sep. 24, 1980

[51] Int. Cl.$^3$ .................................... H01L 21/22
[52] U.S. Cl. ................................ 29/576 B; 29/571; 148/1.5; 148/187; 357/41; 357/91
[58] Field of Search ............... 357/91, 41; 29/576 B, 29/571; 148/1.5, 187

[56] References Cited

U.S. PATENT DOCUMENTS

| | | | |
|---|---|---|---|
| 3,875,656 | 4/1975 | Handi | 29/571 |
| 3,928,081 | 12/1975 | Marley et al. | 148/1.5 |
| 3,982,967 | 9/1976 | Ku et al. | 148/1.5 |
| 4,050,965 | 9/1977 | Ipri et al. | 29/571 |
| 4,183,134 | 1/1980 | Dehler | 29/571 |
| 4,224,088 | 9/1980 | Komatsu | 148/1.5 |
| 4,280,272 | 7/1981 | Egawa et al. | 29/571 |

*Primary Examiner*—Arthur P. Demers
*Attorney, Agent, or Firm*—H. Fredrick Hamann; S. Alfred Uchizono

[57] ABSTRACT

A method of making complementary n-channel and p-channel metal oxide semiconductor (CMOS) device pairs in a common insulatively supported semiconductor layer, including simultaneously converting by exposure to an ion beam adjacently arranged complementary regions in different members of a device pair in said layer from a first to a second conductivity type.

17 Claims, 5 Drawing Figures

METHOD OF MAKING CMOS DEVICES

BACKGROUND OF THE INVENTION

This invention relates to a method of making complementary metal oxide semiconductor (CMOS) device pairs and particularly to the steps in that method relating to the creation by doping of a pattern of adjacently arranged regions of opposing conductivity type in the insulatively supported semiconductor layer of these devices. The invention relates more particularly to the channel doping steps of that method.

In the pertinent CMSO technology, the method is applied to a composite wafer structure typically comprising a sapphire substrate on a major surface of which is formed a thin layer of semiconductor material, typically n type silicon. The CMOS circuitry made from the silicon-on-sapphire (SOS) structure is commonly referred to as CMOS/SOS. In a CMOS/SOS device pair, opposite conductivity type devices, referred to, individually, as n-channel and p-channel devices, are established in a single unit during essentially a single process. Near ideal isolation between devices is afforded by this technology, since the silicon between devices is removed, typically, by etching and each device is contained in an individual island on the sapphire substrate. This isolation, together with the small junction areas and minimum parasitic capacitance possible in an SOS technology, give promise of the realization of the ultimate density and speed potential of MOS circuits.

For either the n-channel or p-channel device, three functional regions, distinguished by the type and concentration of dopant present, are disposed in the silicon island. The first is a central or channel region of a first conductivity type which underlies an insulated conductive electrode commonly referred to as the gate. The other two functional regions are abutting or flanking regions of a second and opposite conductivity type which underlie and are in electrical contact with current path electrodes, one electrode together with its associated functional region commonly referred to as the source and other electrode together with its associated functional region commonly referred to as the drain. To minimize junction capacitance and thereby enhance the speed of the device, it is desirable to minimize the junction area at the interface between the functional regions. Ideally, this can be achieved by creating junction interfaces between doped regions which are at right angles to the plane of the silicon layer and to the edges of the device island.

The type and degree of conductivity in each of these regions is related to the type and relative concentration of impurity ions which are present. Either by design or because of the limitations of the doping technique which is used, these functional regions, typically, are not doped to a uniform impurity concentration from the upper to the lower surface of the silicon layer. For example, to provide a low resistance ohmic contact between the current path electrodes and the respective silicon regions, it is desirable to have impurity concentrations of approximately $10^{18}$ cm$^{-3}$ or greater in the regions adjacent the upper surface of the silicon, whereas all or nearly all of the remainder of the region underlying the electrodes are doped to levels of approximately $10^{15}$ cm$^{-3}$ The channel region is doped with impurity ions producing an opposite conductivity type, at concentrations of, typically, $10^{15}$ to $10^{16}$ cm$^{-3}$.

Among the methods used to create the basic n-p-n and p-n-p conductivity configuration in the individual device islands, is the method where steps are taken first to create symmetrically in a conductivity sense, both entirely n and entirely p conductivity islands, in adjacent pairs, then subsequently, to subject these pairs to steps which counter-dope in a complementary pattern, the regions under the current path electrodes while retaining the precounter-doping conductivity characteristic in the channel region. Ideally, the depth and concentration of the impurities are dictated by design requirements. However, because of the limitations of specific doping techniques and constraints imposed on these techniques in consideration of other desirable features of such devices, such as radiation hardness, the dopant concentration profile has shortcomings which are manifested in the completed devices in terms of undesirable leakage currents, irregular shaped junction interfaces, and parasitic effects along the island edges.

To facilitate good circuit design, predictable device operating characteristics under anticipated environmental extremes is desirable. In particular, to provide reasonable design tolerances to the design of interfacing circuitry, variations in the CMOS device channel inversion voltage threshold should be minimized. It is known that exposure to high energy radiation environments comprising gamma rays, alpha particles, cosmic rays, and other highly energetic particles can induce large variations in the threshold voltage of CMOS/SOS devices where the devices have undergone high temperature processing for determinable time-at-temperature regimes.

DESCRIPTION OF THE PRIOR ART

Heretofore, workers using known methods of making CMOS/SOS devices have achieved limited success in achieving high reliability devices in economically attractive yields because of tendencies toward shorts, leakage, and parasitic effects in fabricated devices. In particular methods, these tendencies came about because of several factors, including firstly, an ignorance of underlying phenomena occurring in the semiconductor regions and at the various interfaces, which gave rise to these tendencies, and secondly, even through definitive investigations which provided an understanding of the phenomena and the design criteria fashioned to overcome these tendencies, an inability to achieve the desired device characteristics because of the limitations of the fabrication process, the equipment, and economic considerations. For example, in a p-channel device fabricated from a lightly doped ($\sim 10^{15}$ cm$^{-3}$) n conductivity type island, the regions adjacent to the upper surface of the silicon underlying the current path electrodes were converted to p+ regions with impurity concentration levels around $10^{19}$ cm$^{-3}$ or greater in some methods by diffusion doping. In the diffusion methods, the ability to counter-dope the drain and source regions down to the silicon/sapphire interface was difficult to control precisely and predictably. Achieving conversion through the thickness of the semiconductor layer using such methods requires predeposition doping followed by a drive-in period at regimes of time and temperature which may result in completed devices which exhibit excessive edge leakage and are susceptible to radiation. Undue radiation susceptibility can be avoided by reducing the time-at-temperature drive-in step, but at the cost of incurring an increased likelihood of an incomplete n to p+ conversion down to the silicon/sapphire interface. Where the n to p+ conversion is not complete, typically, a continuous unconverted n region adjacent to the bottom surface of the island exists over the entire length of the island from drain to source. This results in the formation of p-n junctions at the interface between the p+ and n regions which deviate considerably in area from the minimized area of the ideal junction with planar interfaces perpendicular to both the surface of the silicon layer and the island edges. This increase in junction area increases the junction capacitance, thereby reducing circuit speed. Furthermore, in some device designs, the conductive current path contacts to the drain and source regions are formed in a manner extending over the edges of the island, thereby presenting the possibility of the drain being connected to the source through the resistive path presented by the continuous n region described above. In those methods where opposing conductivity device pair islands are created, similar leakage and shorting problems may exist in the n-channel device.

SUMMARY OF THE INVENTION

It is accordingly a major objective of the invention to provide a method of making complementary n-channel and p-channel MOS device pairs in a common insulatively supported semiconductor layer which results in finished devices exhibiting characteristics of radiation hardness and the reduced likelihood of shorts and of current leakage paths.

It is also an objective of the invention to provide a method of making CMOS/SOS devices of increased operating speed through reduction of the junction capacitances by minimizing the interface area between the adjacent n and p conductivity regions.

Other objectives of the invention include provisions of a method for making CMOS devices having increased process flexibility and yield, a wide latitude in process parameters, and improved device reliability.

These and other objectives of the invention are realized in accordance with the invention in a method of making complementary n-channel and p-channel metal oxide semiconductor (CMOS) device pairs in a common insulatively supported semiconductor layer which includes simultaneously converting by exposure to a conductivity-type-determining ion beam adjacently arranged complementary regions in different members of a device pair in the semiconductor layer from a first to a second conductivity type. Typically, the semiconductor is silicon, and for particular embodiments the first conductivity may be either n type or p type. A further embodiment of this invention provides for converting said adjacently spaced complementary regions from either n to p conductivity type or p to n conductivity type.

The invention further provides a method of making CMOS device pairs from an insulatively supported semiconductor layer of a first conductivity type, which includes simultaneously exposing all selected regions of a CMOS device pair defined by a common ion implant mask and having a second conductivity type in the final device pair configuration different from said first conductivity type to a second conductivity-type-determining ion beam for effecting a conversion through the thickness of the semiconductor layer regions from the first to the second conductivity type, wherein, typically, sapphire provides the insulating support for the semiconductor. For specific embodiments, silicon is insulatively supported by the sapphire, and for further particular embodiments n or p conductivity type silicon is insulatively supported by the sapphire. Still further embodiments of this invention provide for converting regions from n to p conductivity type or p to n conductivity type using either a boron ion implant or phosphorous ion implant, respectively. In another embodiment arsenic ions are used in place of the phosphorous ions.

In a particular embodiment of this invention, an improved method of making CMOS device pairs in an insulatively supported extrinsic semiconductor layer of a first conductivity type is provided which includes exposing selected regions of a CMOS device pair having a second and opposite conductivity type in the final defice configuration as defined by an ion implant mask to a second conductivity type-determining ion beam to effect conversion through the thickness of the semiconductor layer in the exposed regions, wherein the improvement includes simultaneously exposing the selected regions to be converted as defined by the ion implant mask to the ion beam at the channel implant stage of the method.

BRIEF DESCRIPTION OF THE DRAWINGS

The invention will be further described as to particular embodiments in conjunction with the attached drawings in which.

DESCRIPTION OF THE PREFERRED EMBODIMENT

Typically, the insulatively supported semiconductor layer, a wafer like structure, comprises extrinsic silicon formed on a sapphire substrate. The wafer is then subjected to numerous processing steps which constitute a typical method for making n-channel and p-channel CMOS/SOS device pairs. For example, beginning with a n conductivity type silicon wafer, one part of the fabrication process comprises selectively establishing p conductivity type regions corresponding to the location of the current path electrodes in the p-channel device and the channel region in the n-channel device. In the present invention, these regions which are to be converted from n to p conductivity type are simultaneously doped in conjunction with suitable ion implant masking at the channel implant stage of the overall method.

Figure 1:
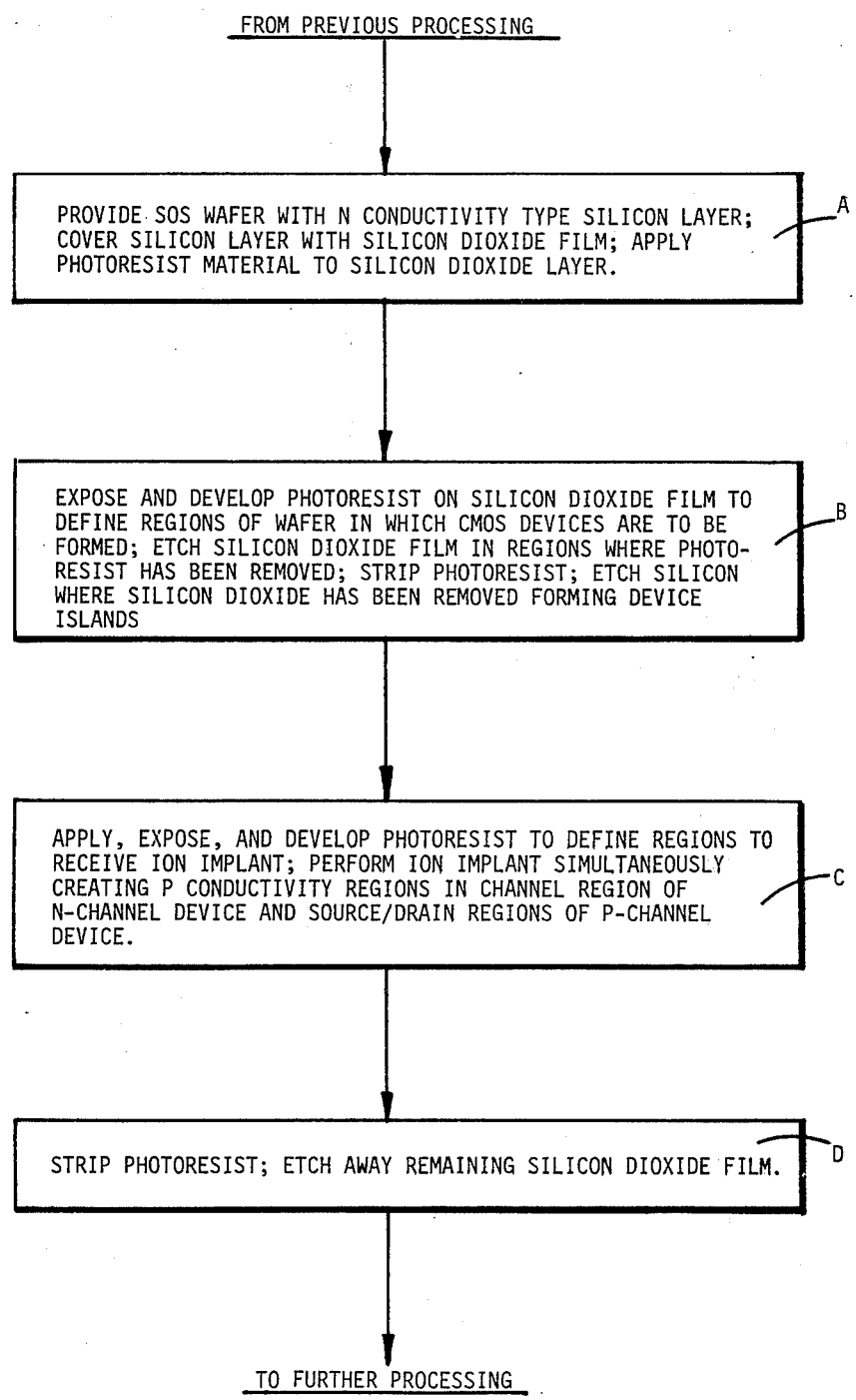
FIG. 1 is a flow diagram indicating that portion of the overall method for making CMOS/SOS device pairs to which the present invention relates.

Referring now to FIG. 1 and to corresponding structural representations in FIGS. 2A–2D, a basic wafer to be processed is provided at A (FIG. 1) comprising a silicon-on-sapphire (SOS) structure of n conductivity type silicon on the sapphire substrate 30, such as may be provided, typically, by ion implantation of an intrinsic silicon layer, or by an epitaxial process. The silicon layer is typically 0.5 to 0.75 microns thick. When starting with an n conductivity type silicon layer 32 (FIG. 2A), the significant aspects of this preferred embodiment relate to the selective conversion of portions of the n conductivity type regions 32C (FIG. 2B) to p conductivity type regions 32G and 32H (FIG. 2C) by ion implantation.

Figure 2A:
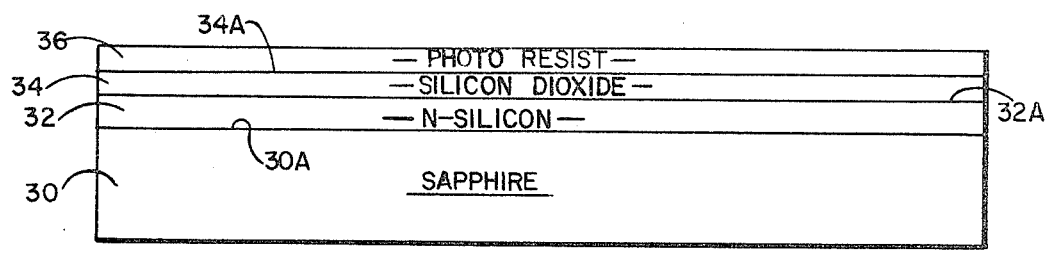
FIGS. 2A–2D are cross-sectional schematic representations of the method of making CMOS/SOS device pairs to which the present invention relates.
Figure 2B:
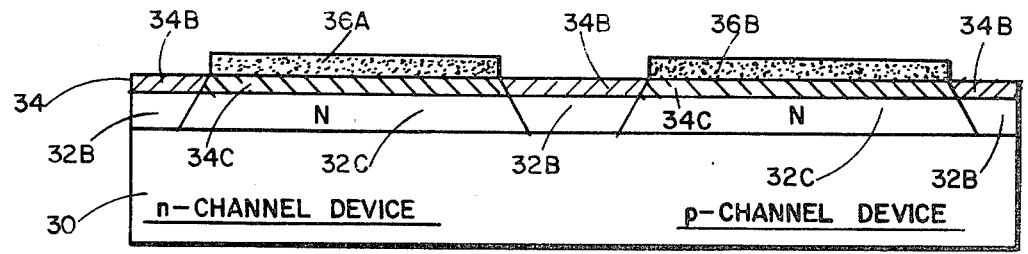

Individual islands 32C of n conductivity type silicon, which ultimately are to be the n-channel and p-channel devices, are formed, with reference to FIGS. 2A and 2B particularly, after a pre-oxidation cleaning of the silicon surface 32A followed by the conventional formation of a silicon dioxide layer 34, typically 200 to 2000 angstroms thick on the silicon surface 32A of the wafer. A photoresist material 36 is formed on the silicon dioxide surface 34A, such that after the application, exposure, and development, the photoresist portions which remain, 36A and 36B, define the island areas where the ultimate n-channel and p-channel devices are to be located, respectively. In those regions 34B where the photoresist has been removed, the silicon dioxide layer 34 is then etched with buffered hydrofluoric acid down to the silicon surface 32A. The remaining photoresist portions, 36A and 36B, are then removed with a suitable solvent, followed by a brief hydroflouric acid etch and rinse in deionized water. Those portions 32B of the silicon layer 32 which are now exposed by the selective removal of the silicon dioxide 34 in the etching step is now subjected to an etchant mixture of potassium hydroxide and isopropyl alcohol at 60° to 65° C. until the sapphire layer surface 30A appears clear from above. The wafer is removed from the etchant, bathed in deionized water, cleansed in a 2:1 sulfuric acid/hydrogen peroxide bath for 10 minutes followed by a deionized water rinse for 5 minutes, and then spun dry. The silicon layer 32 has now been delineated into islands 32C corresponding to the eventual n and p-channel devices.

Figure 2C:
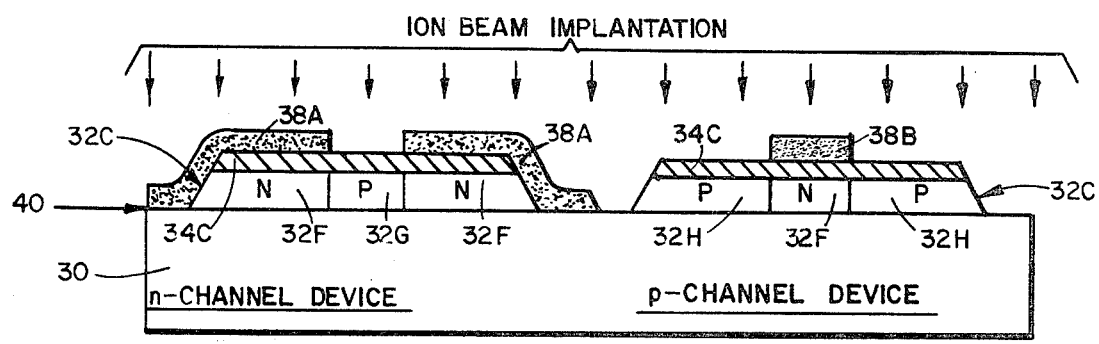
Figure 2D:
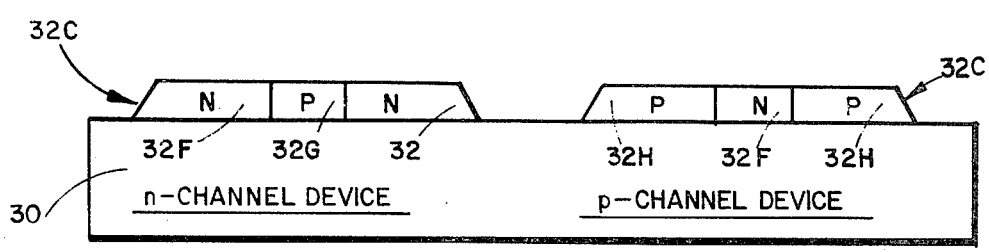

With particular reference now to FIG. 2C, the formation of photoresist portions, 38A and 38B, in a complementary ion implant pattern, is depicted with selected regions 32F of the silicon islands 32C being covered with a photoresist material, to prevent implant ions from penetrating and reaching into the silicon material 32F where the photoresist portions, 38A and 38B, are formed. The first step is to apply the photoresist material (not shown) on the silicon dioxide surface 34A, then selectively exposing and developing the photoresist material leaving portions 38A and 38B covering all silicon surface areas except the channel region 32G of the ultimate n-channel device and the source and drain regions 32H of the ultimate complementary p-channel device. The unmasked regions, 32G and 32H extend sufficiently beyond the edges of the silicon islands 32C to allow ion implantation of the edges down to the silicon-sapphire interface 40 but not to the extent of exposing the edges of the adjacent silicon islands. With particular reference now to FIG. 2C, a signal step of the invention method is carried out by implanting boron ions ($^{11}B^+$), indicated by the downwardly directed arrows in FIG. 2C, simultaneously in region 32G and regions 32H, corresponding respectively, to the channel region of the n-channel device and drain and source regions in the p-channel device. The implanting ion energy and dosage are typically 200 Kev and $5 \times 10^{11}$ cm$^{-2}$, respectively, resulting in typical ion concentrations of $10^{14}$ to $10^{16}$ cm$^{-3}$. After the implant, the photoresist portions, 38A and 38B, are removed using a suitable solvent and the remaining silicon dioxide coating 34C (FIG. 2C) is then removed by a suitable etchant followed by a rinse in deionized water. This concludes the channel implant stage of this embodiment of the invention. The resulting device, shown in FIG. 2D, is then passed to further processing, which may include so-called drain/source doping wherein, typically, additional doping is required to achieve high conductivity for a good ohmic contact between the drain and source and the conductive electrodes attached thereto.

Certain details of the invention steps may be altered, e.g., ion implantation may procede island delineation for particular purposes, while retaining the advantages of the invention over the prior art. The preferred embodiment is illustrative of the invention and not restrictive and the scope of the invention is limited only by the appended claims.

It will be noted that in accordance with the objects of the invention, a method of making CMOS/SOS device pairs is realized in which conductivity type conversion through to the sapphire surface is achieved without the use of diffusion doping, at lower processing temperatures associated with ion implantation thus enabling fabrication of CMOS/SOS device pairs which are improved with respect to incidence of leakage prone channels and nonetheless radiation hard.

What is claimed is:

1. A method of making complementary n-channel and p-channel metal oxide semiconductor (CMOS) device pairs in a common insulatively supported semiconductor layer, including simultaneously converting by exposure to a conductivity-type-determining ion beam adjacently arranged complementary regions in different members of a device pair in said layer from a first to a second conductivity type.

2. The method according to claim 1, including also providing silicon as said semiconductor layer.

3. The method according to claim 1, including also providing n conductivity type silicon as said semiconductor layer.

4. The method according to claim 3, including also converting said regions from n to p conductivity type.

5. The method according to claim 1 including also providing p conductivity type silicon as said semiconductor layer.

6. The method according to claim 5, including also converting said regions from p to n conductivity type.

7. A method of making complementary n-channel and p-channel metal oxide semiconductor (CMOS) device pairs from an insulatively supported semiconductor layer of a first conductivity type, including simultaneously exposing all selected regions of a CMOS device pair defined by a common ion implant mask and having a second conductivity type in the final device pair configuration different from said first conductivity type to a second conductivity-type-determining ion beam for effecting a conversion through the thickness of said semiconductor layer regions from said first to said second conductivity type.

8. The method according to claim 7, including also insulatively supporting said semiconductor layer on sapphire.

9. The method according to claim 8, including also providing silicon as said semiconductor layer.

10. The method according to claim 9, including also providing n conductivity type silicon as said silicon layer.

11. The method according to claim 10, including also converting said selected regions of said n conductivity type silicon layer to p conductivity type.

12. The method according to claim 11, including also implanting boron ion to effect said conversion 13. The method according to claim 9, including also providing p conductivity type silicon as said silicon layer.

14. The method according to claim 13, including also converting said selected regions of said p conductivity type silicon layer to n conductivity type.

15. The method according to claim 14, including also implanting phosphorous ion to effect said conversion.

16. The method according to claim 14, including also implanting arsenic ion to effect said conversion.

17. In a method of making complementary n-channel and p-channel metal oxide semiconductor (CMOS) device pair from an insulatively supported extrinsic semiconductor layer of a first conductivity type which includes exposing selected regions of a CMOS device pair having a second and opposite conductivity type in the final device configuration as defined by an ion implant mask to a second conductivity type-determining ion beam to effect conversion through the thickness of said semiconductor layer in said exposed regions, the improvement including simultaneously exposing said selected regions to be converted as defined by said ion implant mask to said ion beam at the channel implant stage of said method.

* * * * *

UNITED STATES PATENT AND TRADEMARK OFFICE
CERTIFICATE OF CORRECTION

PATENT NO. : 4,335,504
DATED : June 22, 1982
INVENTOR(S) : Steven N. Lee

It is certified that error appears in the above-identified patent and that said Letters Patent are hereby corrected as shown below:

Column 1, line 13, change [CMSO] to read --CMOS--.

Signed and Sealed this

Twenty-first Day of December 1982

[SEAL]

Attest:

Attesting Officer

GERALD J. MOSSINGHOFF

Commissioner of Patents and Trademarks